United States Patent
Kim et al.

(10) Patent No.: US 11,322,109 B2
(45) Date of Patent: May 3, 2022

(54) NARROW BEZEL PANEL DISPLAY

(71) Applicant: LG Display Co., Ltd., Seoul (KR)

(72) Inventors: Daehoon Kim, Seoul (KR); Yuseok Jung, Asan-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 17/025,492

(22) Filed: Sep. 18, 2020

(65) Prior Publication Data

US 2021/0005154 A1    Jan. 7, 2021

Related U.S. Application Data

(62) Division of application No. 15/841,096, filed on Dec. 13, 2017, now Pat. No. 10,818,257.

(30) Foreign Application Priority Data

Dec. 23, 2016 (KR) .................. 10-2016-0178498

(51) Int. Cl.
*G09G 3/36* (2006.01)
*H01L 27/12* (2006.01)
(Continued)

(52) U.S. Cl.
CPC ......... *G09G 3/3677* (2013.01); *G02F 1/1339* (2013.01); *G02F 1/13454* (2013.01);
(Continued)

(58) Field of Classification Search
CPC ............... G09G 3/3677; G09G 3/3648; G09G 2320/0223; G09G 2300/0426;
(Continued)

(56) References Cited

U.S. PATENT DOCUMENTS

2005/0180083 A1    8/2005   Takahara et al.
2009/0096975 A1    4/2009   Kwon et al.
(Continued)

FOREIGN PATENT DOCUMENTS

CN    101414086 A    4/2009
CN    103365009 A    10/2013
(Continued)

OTHER PUBLICATIONS

China National Intellectual Property Administation, Notification of the First Office Action, CN Patent Application No. 201711406522.1, dated Jun. 2, 2020, 19 pages.
(Continued)

*Primary Examiner* — Abhishek Sarma
(74) *Attorney, Agent, or Firm* — Fenwick & West LLP

(57) ABSTRACT

Disclosed are embodiments of a narrow bezel display. The narrow bezel display has a structure in which output terminals of gate circuits are connected to jumping units through wires having a multistage path, thereby reducing the bezel size of a display. A dielectric layer may be disposed under the multistage path without placing another wire layer thereunder to prevent non-uniform capacitance between the wires and an underlying wire layer. Thus, a dimming phenomenon may be prevented during operation of the display or a short circuit may be prevented during an electrostatic test.

13 Claims, 13 Drawing Sheets

(51) Int. Cl.
   *G02F 1/1339* (2006.01)
   *G02F 1/1345* (2006.01)
   *G02F 1/1362* (2006.01)
(52) U.S. Cl.
   CPC ......... *G09G 3/3648* (2013.01); *H01L 27/124* (2013.01); *G02F 1/13398* (2021.01); *G02F 1/13452* (2013.01); *G02F 1/13629* (2021.01); *G02F 2201/50* (2013.01); *G09G 2300/0408* (2013.01); *G09G 2300/0413* (2013.01); *G09G 2300/0426* (2013.01); *G09G 2310/08* (2013.01); *G09G 2320/0223* (2013.01)
(58) Field of Classification Search
   CPC ....... G09G 2310/08; G09G 2300/0413; G09G 2300/0408; G09G 3/3674; G02F 1/13454; G02F 1/1339; G02F 1/13398; G02F 1/13629; G02F 1/13452; G02F 2201/50; G02F 1/13394; G02F 1/133308; G02F 1/136286; G02F 1/1345; G02F 1/1309; H01L 27/124
   See application file for complete search history.

(56) References Cited

U.S. PATENT DOCUMENTS

| | | |
|---|---|---|
| 2011/0096258 A1 | 4/2011 | Shim et al. |
| 2013/0044044 A1 | 2/2013 | Ha et al. |
| 2013/0147779 A1 | 6/2013 | Ochiai et al. |
| 2013/0295702 A1 | 11/2013 | Kwon et al. |
| 2014/0022230 A1* | 1/2014 | Hasumi ................ G09G 3/3696 345/212 |
| 2014/0375534 A1 | 12/2014 | Lee et al. |
| 2015/0243238 A1 | 8/2015 | Jung et al. |
| 2016/0104757 A1 | 4/2016 | Kim et al. |
| 2016/0111040 A1 | 4/2016 | Kim et al. |
| 2016/0342057 A1 | 11/2016 | Zhang et al. |
| 2017/0033312 A1* | 2/2017 | Kim .................... H01L 27/3276 |

FOREIGN PATENT DOCUMENTS

| | | |
|---|---|---|
| CN | 104409455 A | 3/2015 |
| CN | 104867462 A | 8/2015 |
| EP | 2 660 650 A1 | 11/2013 |
| KR | 10-2014-0096601 A | 8/2014 |
| TW | 201519022 A | 5/2015 |
| WO | WO 2009/104930 A2 | 8/2009 |

OTHER PUBLICATIONS

The Intellectual Property Office of the United Kingdom, Combined Search and Examination Report under Sections 17 and 18(3), GB Patent Application No. GB1721366.1, dated Jun. 21, 2018, seven pages.
Taiwan Intellectual Property Office, First Office Action, TW Patent Application No. 106139747, dated Aug. 17, 2018, four pages.
United States Office Action, U.S. Appl. No. 15/841,096, filed May 28, 2020, eight pages.
United States Office Action, U.S. Appl. No. 15/841,096, filed Dec. 11, 2019, 11 pages.
United States Office Action, U.S. Appl. No. 15/841,096, filed Sep. 13, 2019, 12 pages.
United States Office Action, U.S. Appl. No. 15/841,096, filed Feb. 7, 2019, nine pages.
Office Action, German Patent and Trade Mark Office Patent Application No. 10 2017 129 686.7, dated Jan. 11, 2022, 11 pages.

* cited by examiner (Related Art)

(Related Art)

NARROW BEZEL PANEL DISPLAY

CROSS-REFERENCE TO RELATED APPLICATIONS

This application is a divisional of U.S. patent application Ser. No. 15/841,096, filed on Dec. 13, 2017, which claims priority under 35 U.S.C. § 119(a) of Republic of Korea Patent Application No. 10-2016-0178498, filed on Dec. 23, 2016, all of which are hereby incorporated by reference in its entirety.

BACKGROUND

1. Technical Field

The present disclosure relates to a narrow bezel display, and more particularly, to a narrow bezel display that may realize a narrow bezel.

2. Description of the Related Art

Displays have been studied in terms of both technical performance and design. Particularly, in recent years, the necessity of research and development for display design that can appeal to consumers is emphasized.

Narrow bezel technology for reducing the width of a frame of a display is being actively studied.

Specifically, narrow bezel technology is aimed at increasing the relative size of an image display portion by minimizing the width of the frame of a display panel.

In the display panel, gate driver in panel (GIP) devices for driving gate lines of the display panel can be disposed at right and left edges (e.g., non-display regions) where no image is output.

Particularly, in narrow bezel technology, the GIP devices may be divided into odd-numbered GIP devices arranged in one non-display area and even-numbered GIP devices in the other non-display area.

The odd-numbered GIP devices may be connected to odd-numbered gate lines by a single feeding method and are connected to one another by a cascade method to generate gate signals to be supplied to the odd gate lines.

The even-numbered GIP devices may be connected to even-numbered gate lines by the single feeding method and are connected to one another by the cascade method to generate gate signals to be supplied to the even gate lines.

In a typical technique employing single feeding-type GIP devices, challenges may arise when implementing a narrow bezel.

SUMMARY

In various embodiments, a display includes gate circuits arranged at predetermined intervals in a non-display area and jumping units arranged in a display area to be asymmetrical to the arrangement of the gate circuits. The display also includes signal transmission units arranged in the non-display area and each having a multistage paths to electrically connect the gate circuits to the jumping units and a dielectric layer disposed under the signal transmission unit. In some embodiments, each signal transmission unit has a multistage path. Multistage paths may be identical or vary between different signal transmission units.

In one or more embodiments, the multistage paths may include straight paths and an inclined path connecting the straight paths to one another.

In one or more embodiments, the multistage paths may include straight paths and a right-angled path connecting the straight paths to one another.

In one or more embodiments, the display may further include a common voltage wire layer disposed under the jumping units.

In one or more embodiments, area in which the multistage paths overlap the common voltage wire layer may be uniform, e.g., in size or dimensions.

In various embodiments, the display includes a lower substrate defining a display area and a non-display area and a driving layer stacked on the lower substrate in the non-display area and comprising a gate circuit and a common voltage wire layer with a spacing region therebetween. The display also includes a dielectric layer filling the spacing region, a protective layer stacked on the driving layer, a pixel disposed on the protective layer above and overlapping with the spacing region, and an upper substrate disposed on the protective layer.

In one or more embodiments, the gate circuit may include gate circuits arranged at predetermined intervals.

In one or more embodiments, the display may further include jumping units arranged in the display area to be asymmetrical to the arrangement of the gate circuits.

In one or more embodiments, the display may further include signal transmission units arranged in the non-display area and having multistage paths to electrically connect the gate circuits to the jumping units.

In one or more embodiments, the display may further include a pigment layer disposed on the driving layer.

In one or more embodiments, the pigment layer may cover overlap with the spacing region.

In one or more embodiments, the display may further include a black column spacer under the upper substrate.

In one or more embodiments, the black column spacer may cover overlap with the spacing region.

In one or more embodiments, areas in which the multistage paths overlap the common voltage wire layer may uniform.

In one or more embodiments, the non-display area may include a first non-display area and a second non-display area disposed at opposite sides (e.g., a left and right side, or a top and bottom side) of the display area.

In one or more embodiments, the display may further include a synchronization unit disposed in the second non-display area to synchronize output signals generated from the gate circuit. The gate circuit may be disposed in the first non-display area.

In various embodiments, a display includes pixels in a display area of a substrate. The display also includes gate circuits separated by a first distance in a first direction in a non-display area of the substrate, and jumping units separated by a second distance in the first direction in the non-display area. The second distance may be greater than the first distance, and the jumping units are connected to the pixels. The display also includes multistage wires electrically connecting the gate circuits to the jumping units. The multistage wires include first wires parallel to the first direction and second wires parallel to a second direction different than the first direction. The multistage wires transmit output signals generated by the gate circuits to the pixels to display an image.

In one or more embodiments, the first direction is orthogonal to the second direction.

In one or more embodiments, the display also includes additional jumping units arranged in another non-display area. The non-display area and the other non-display area are adjacent to different sides of the display area. The display also includes a signal transmission line electrically connecting the gate circuits to the additional jumping units. The signal transmission line transmits the output signals generated by the gate circuits to the additional jumping units. The display also includes a synchronization unit disposed in the other non-display area to synchronize the output signals transmitted by the signal transmission line.

In one or more embodiments, the synchronization unit compensates for a voltage delay between first output signals output by the jumping units and second output signals output by the additional jumping units.

In one or more embodiments, the display also includes a common voltage wire layer disposed between the multistage wires and the substrate. A first one of the multistage wires overlapping a first area of the common voltage wire layer, and a second one of the multistage wires overlapping a second area of the common voltage wire layer. The first area may have a same area as the second area.

In one or more embodiments, the common voltage wire layer is on a same layer on the substrate as a gate circuit of the gate circuits.

In one or more embodiments, the display also includes a dielectric layer on the substrate separating the common voltage wire layer from the gate circuit. The dielectric layer may be on the same layer as the common voltage wire layer and the gate circuit.

In one or more embodiments, the display also includes a pigment layer on the common voltage wire layer and the gate circuit. The display also includes a protective layer on the pigment layer, where the protective layer includes a groove. The display also includes a black seal disposed in the groove, where the black seal and the pigment layer prevent light leakage in the non-display area.

In one or more embodiments, the pigment layer includes a first pigment layer overlapping the common voltage wire layer and the gate circuit. The pigment layer includes a second pigment layer adjacent to the groove of the protective layer, where the first and second pigment layers may have different colors.

BRIEF DESCRIPTION OF THE DRAWINGS

The above and other aspects, features, and advantages of embodiments of the present invention will become apparent from the detailed description of the following embodiments in conjunction with the accompanying drawings, in which.

DETAILED DESCRIPTION

Figure 1:
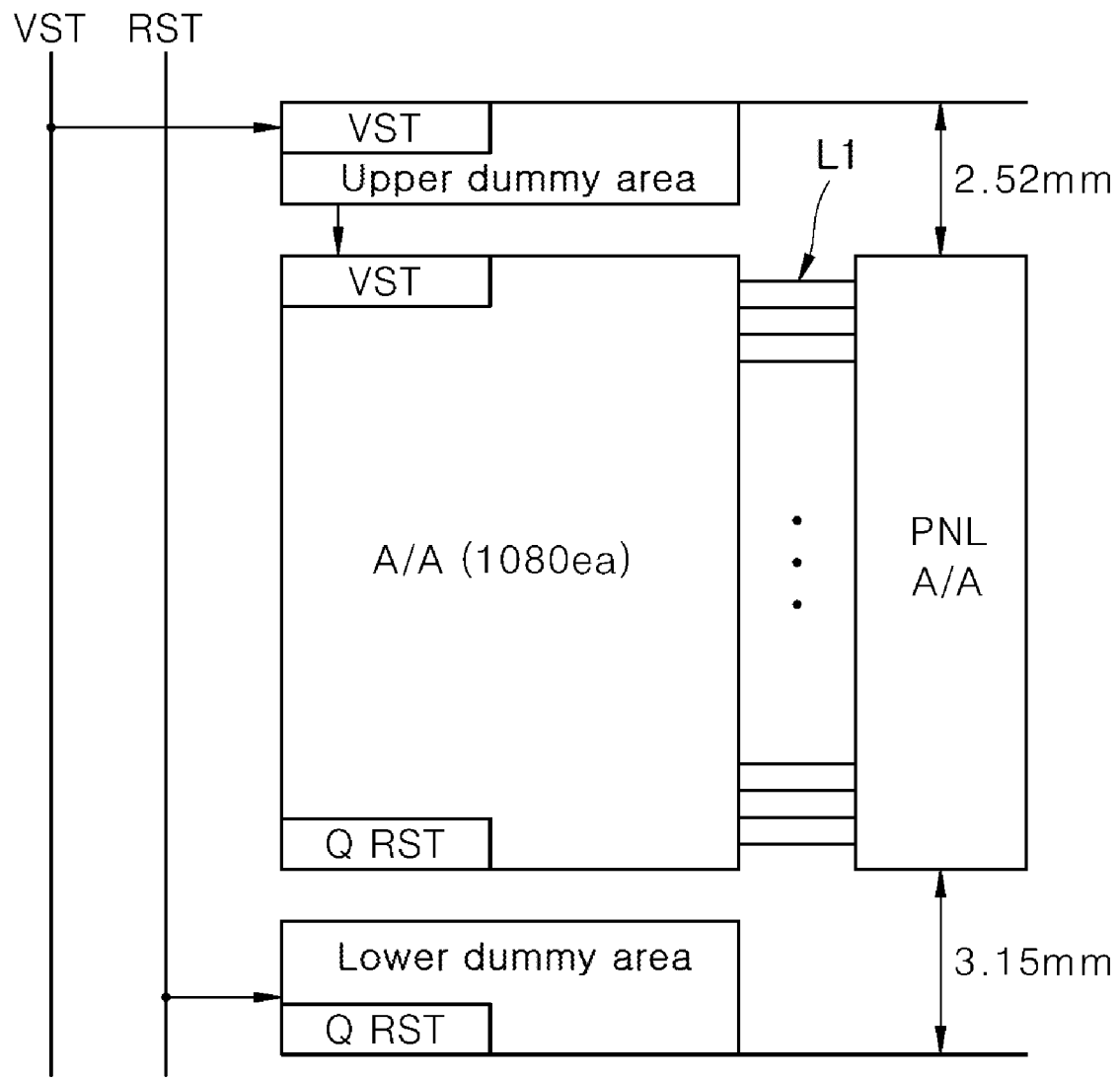
FIG. 1 is a schematic view of a related art display having a typical bezel.

Hereinafter, embodiments of the present invention will be described with reference to the accompanying drawings. It should be understood that the present invention may be embodied in different ways and is not limited to the following embodiments.

It should be understood that like components may be denoted by like reference numerals throughout the specification and the accompanying drawings. In addition, descriptions of details apparent to those skilled in the art may be omitted for clarity.

It should be understood that, when an element such as a layer, film, region or substrate is referred to as being placed above, below, on, or under another element, the element may be directly placed on the other element, or the element may be indirectly placed on the other element. In addition, it should be understood that intervening layer(s) may also be present.

Figure 2:
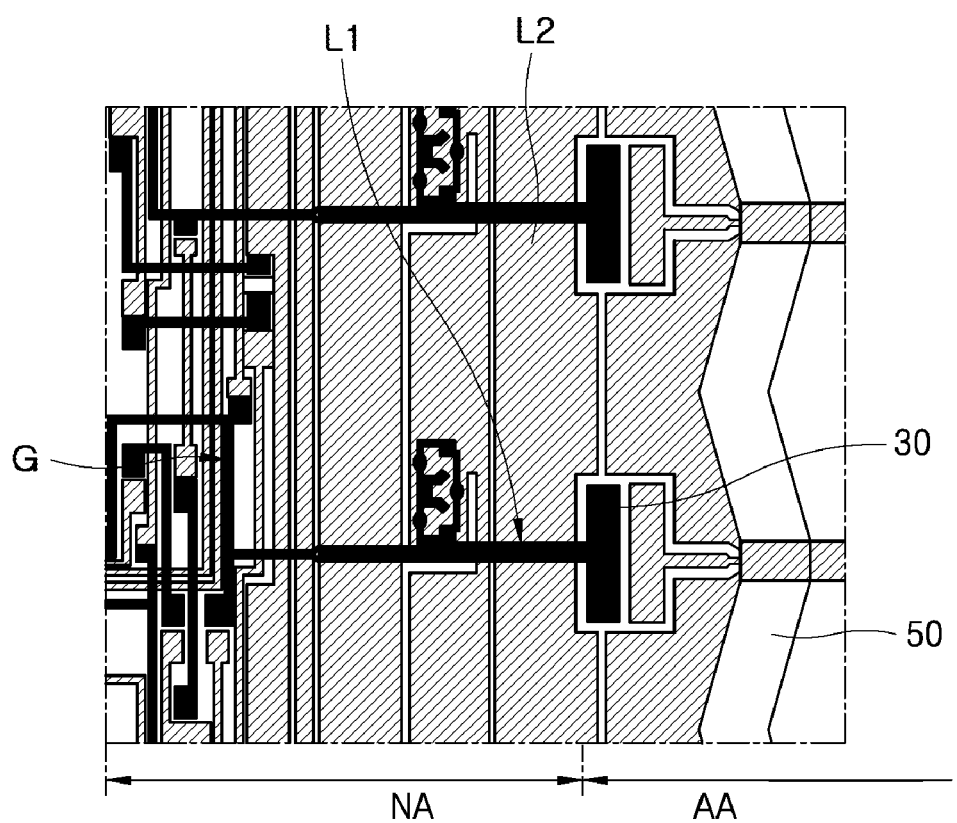
FIG. 2 is a plan view of an arrangement of a gate output unit of the display shown in FIG. 1.

FIG. 1 is a schematic view of a related art display having a typical bezel and FIG. 2 is a plan view of an arrangement of a gate output unit of the display shown in FIG. 1. Referring to FIGS. 1 and 2, a typical display includes a display area AA (or "A/A") and a non-display area NA (or "N/A"). Gate circuits G are disposed in the non-display area as shown in FIG. 2. The gate circuits G transmit output signals to respective pixels located in the display area AA through wires.

As shown in FIG. 1, gate output terminals at ends of the gate circuits G are connected to jumping units 30 in the display area AA through primary wires L1. As shown in FIG. 1, an upper dummy area is disposed on an upper side of the non-display area NA and a lower dummy area is disposed under a lower side of the non-display area.

For example, in a display having a typical bezel in which a gap between the upper side of the display area AA and an upper side of the upper dummy area is 2.52 mm, and a gap between the lower side of the display area AA and a lower side of the lower dummy area is 3.15 mm, the gate output terminals are connected to the jumping units 30 in a one-to-one manner through the respective primary wires L1.

As shown in FIGS. 1 and 2, the gate output terminals may be arranged to face the jumping units 30, and the primary wires L1 may horizontally extend. In addition, secondary wires L2 for transmitting electrical signals are disposed under the primary wires L1.

Since areas in which the primary wires L1 overlap the secondary wires L2 are uniform, capacitance between the primary wires L1 and the secondary wirings L2 can also be uniform.

Figure 3:
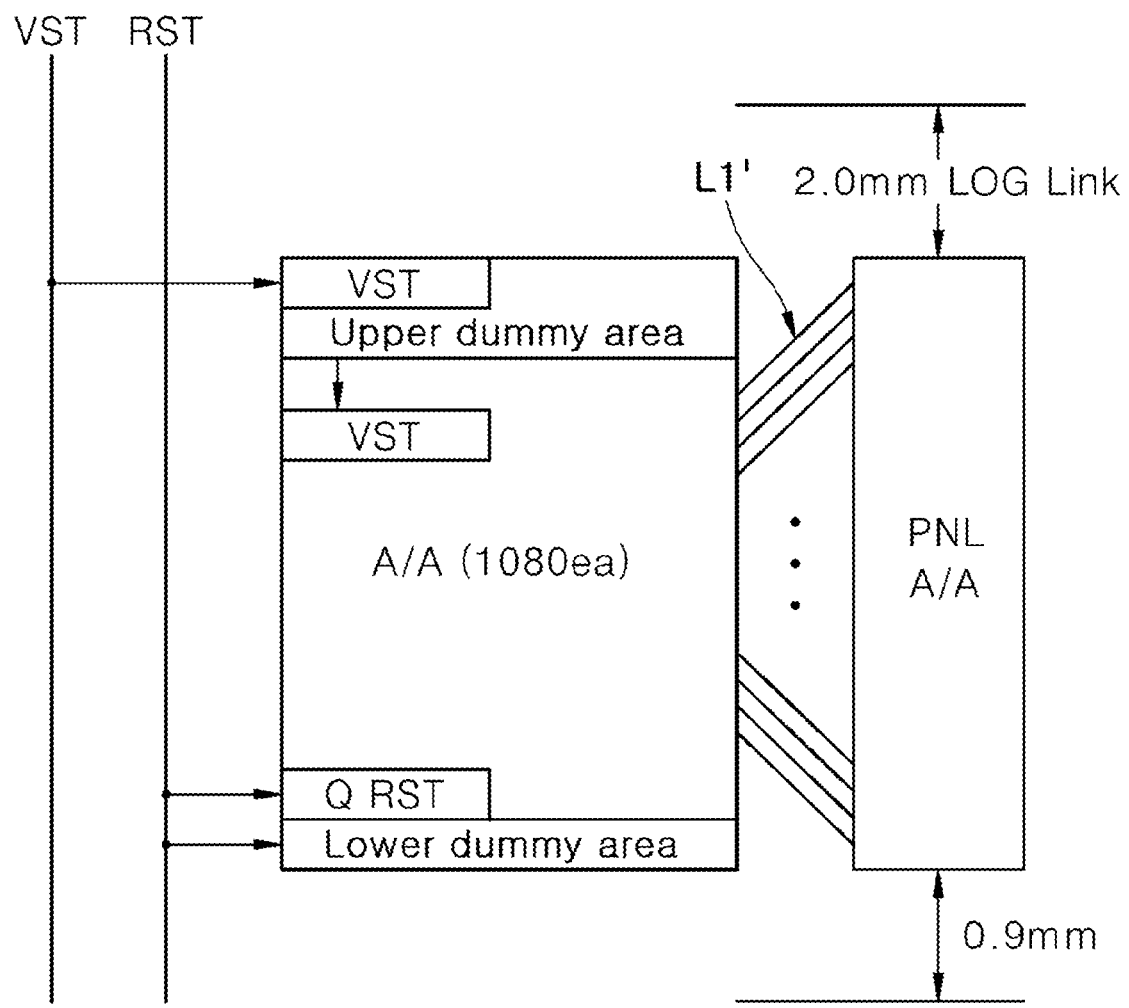
FIG. 3 is a schematic view of a related art display having a typical narrow bezel.
Figure 4:
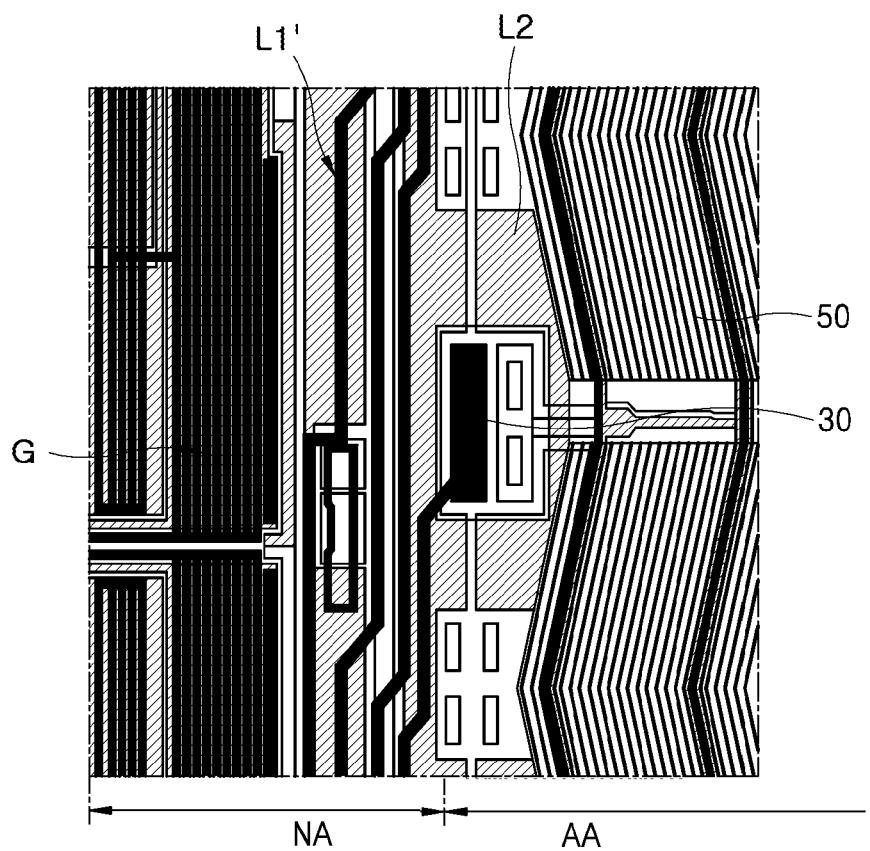
FIG. 4 is a plan view of an arrangement of a gate output unit of the display shown in FIG. 3.

FIG. 3 is a schematic view of a related art display having a typical narrow bezel and FIG. 4 is a plan view of an arrangement of a gate output unit of the display shown in FIG. 3.

Unlike in the display having a typical bezel as shown in FIGS. 1 and 2, in the display having a narrow bezel as shown in FIG. 3, the widths of an upper dummy area, a lower dummy area, and a non-display area NA may be reduced corresponding to the width of a display area AA. When the dummy areas are reduced to form a narrow bezel as described above, the distance between gate output terminals as shown in FIG. 3 is shorter than the distance between the gate output terminals as shown in FIG. 1.

As a result, the area in which the primary wires L1 connecting the gate output terminals in the non-display area NA to the jumping units 30 in the display area AA is reduced. Thus, it is difficult to arrange the primary wires L1 in a narrow area. Conventionally, in order to solve such a problem, primary wires L1' having a bent path are used to connect the gate output terminals to the jumping units 30. In the display, secondary wires L2 are disposed under the primary wires L1' as shown in FIG. 4. In this structure, there is a problem that areas in which the primary wires L1' overlap the secondary wires L2 are not uniform.

Since each of the primary wires L1' has a bent path, areas in which the primary wires L1' overlap the secondary wires L2 along the bent paths thereof are not uniform. As a result, capacitance between the primary wires L1' and the secondary wires L2 along the paths of the primary wires L1' is not uniform. The capacitance imbalance can cause output signals from the gate output terminals to be delayed. As a result, a dimming phenomenon may occur when an image is displayed in the display area AA.

In addition, a short circuit may occur in areas of the display in which the capacitance is not uniform when an electrostatic test is conducted. In other words, when test signals are transmitted to corresponding pixels 50 through the gate output terminals, a short circuit may occur between the primary wires L1' in the areas in which the capacitance is not uniform, making it difficult to drive the display.

Figure 5:
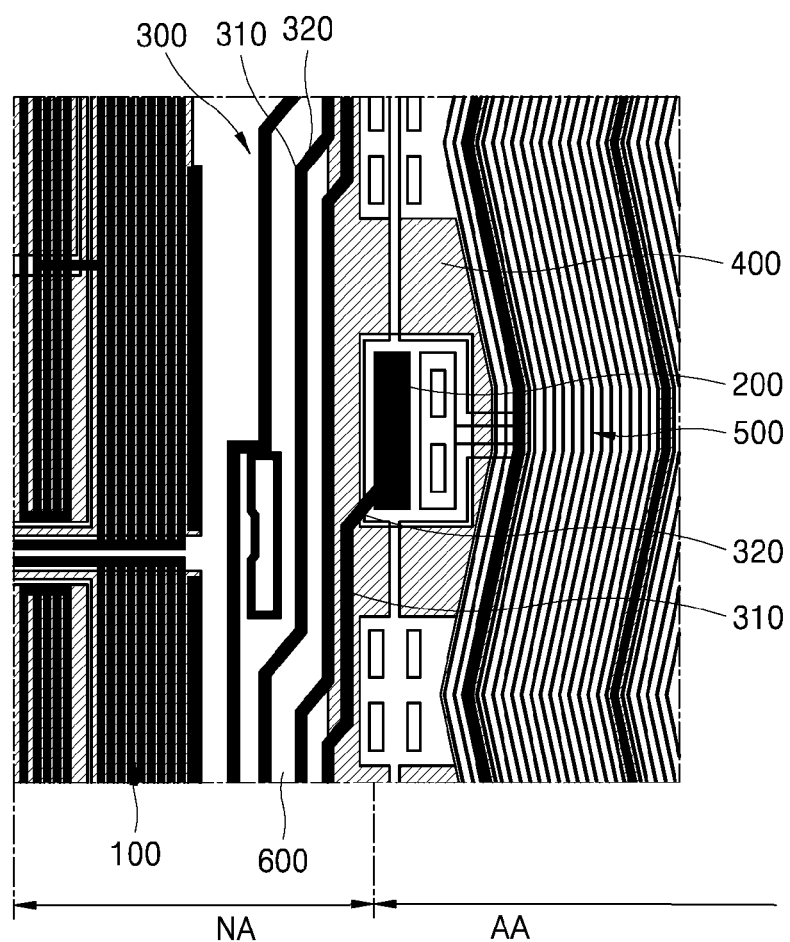
FIG. 5 is a plan view of a narrow bezel display including a signal transmission unit according to an embodiment.

FIG. 5 is a plan view of a narrow bezel display including a signal transmission unit according to an embodiment. Referring to FIG. 5, the narrow bezel display includes a lower substrate 20 (shown in FIG. 7B) defining a non-display area NA and a display area AA.

Gate circuits 100 are disposed in the non-display area NA. The gate circuits 100 may be arranged at predetermined intervals on the lower substrate 20 in a transverse direction (e.g., in the vertical direction as shown in FIG. 5) of the lower substrate 20 in the non-display area NA. An end of the gate circuits 100 are gate output terminals (not shown in FIG. 5).

A plurality of jumping units 200 may be arranged at predetermined intervals in the transverse direction of the lower substrate 20 in the display area AA opposite (e.g., adjacent to) the non-display area NA. The jumping units 200 are electrically connected to corresponding pixels 500.

In the embodiment shown in FIG. 5, the gate circuits 100 are arranged to be adjacent to the jumping units 200 and the distance between adjacent gate circuits 100 in the transverse direction is shorter than the distance between adjacent jumping units 200, e.g., because the gate circuits 100 are arranged at a first interval (e.g., distance) apart from each other, and the jumping units 200 are arranged at a second (and different) interval apart from each other.

Accordingly, a region of the non-display area NA in which the gate circuits 100 are arranged can be narrowed in the transverse direction, thereby providing a narrow bezel. For example, by reducing the distance (e.g., the first interval) between the gate circuits 100, a portion of the non-display area NA of the display may have a shorter width (e.g., in the transverse direction) than the width of the display area AA, e.g., similar to the configuration shown in FIG. 3. Thus, an upper dummy area and/or a lower dummy area may be disposed on one or more sides (e.g., a top and bottom side) of the portion of the non-display area NA including the gate circuits 100 without increasing (or reducing an increase in) the bezel width of the display in the transverse direction. The gate circuits 100 and the jumping units 200 may be arranged asymmetrical to one another rather than symmetrical. The gate circuits 100 are electrically connected to the respective jumping units 200 through a signal transmission unit according to an embodiment. The signal transmission unit includes a primary wire 300 having a multistage path.

The primary wire 300 may be composed of a plurality of primary wires. The plurality of primary wires 300 electrically connects the gate circuits 100 to the jumping units 200. In some embodiments, each of the plurality of primary wires 300 may be connected at one end thereof to a gate output terminal of the gate circuit 100. In some embodiments, each of the plurality of primary wires 300 may be connected at the other end thereof to a jumping unit 200. In some embodiments, each of the primary wires 300 has a multistage path.

In the example shown in FIG. 5, the multistage path includes a straight path 310 and an inclined path 320. The straight path 310 extends in the transverse direction (e.g., vertically) of the lower substrate 10. The straight path 310 may include a plurality of straight paths. The plurality of straight paths is arranged in multiple rows between the gate circuits 100 and the jumping units 200. The inclined path 320 connects the plurality of straight paths 310 to one another. Thus, in some embodiments, the inclined path 320 also includes a plurality of inclined paths. The plurality of inclined paths 320 electrically connects the plurality of straight paths 310 to one another. Among the inclined paths 320, one may be connected to the gate output terminal of the gate circuit 100 and another may be connected to the jumping unit 200.

In the embodiment shown in FIG. 5, the straight paths 310 are arranged in multiple rows and connected to one another through the inclined paths 320, whereby the width of an area in which the primary wires 300 are disposed can be reduced.

Figure 6:
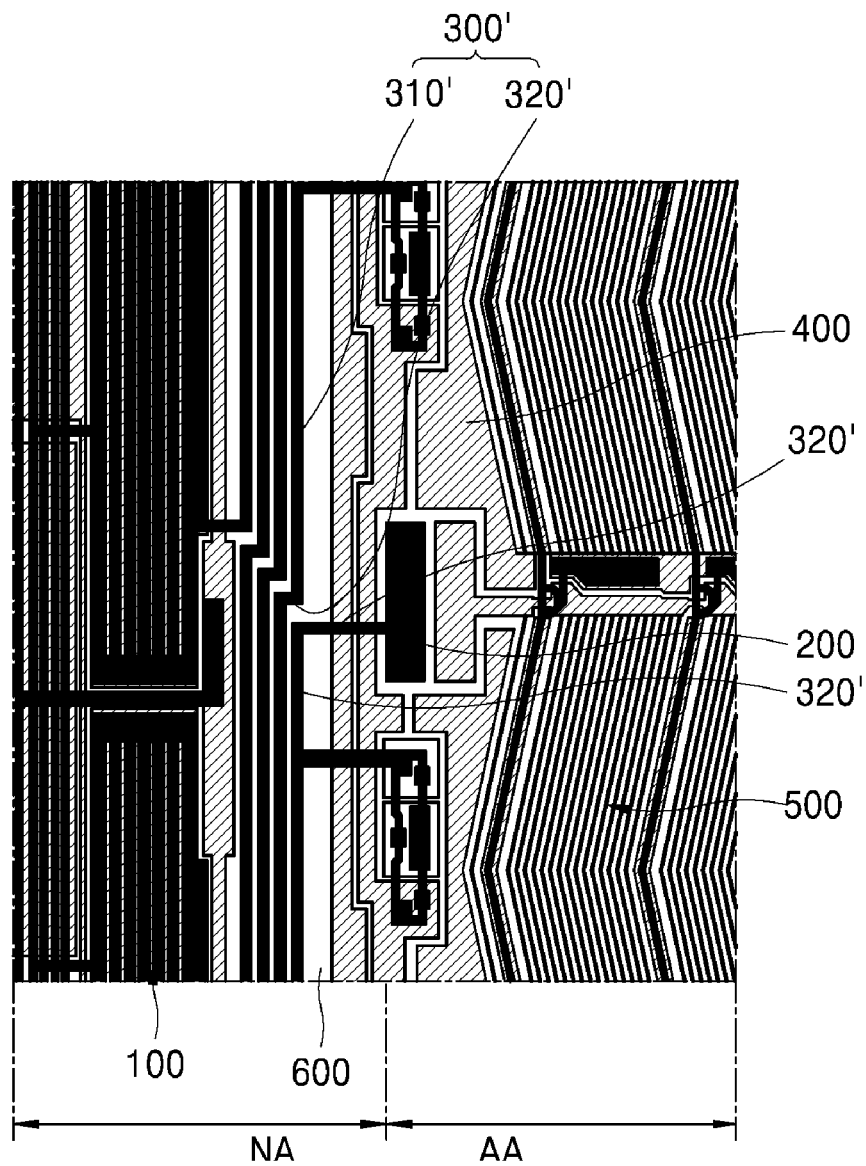
FIG. 6 is a plan view of a narrow bezel display including a signal transmission unit according to an embodiment.

FIG. 6 is a plan view of a narrow bezel display including a signal transmission unit according to an embodiment. Referring to FIG. 6, the narrow bezel display according to an embodiment includes a lower substrate 20 defining a non-display area NA and a display area AA. In this embodiment, arrangements of gate circuits 100 and jumping units 200 are substantially the same as those described above with respect to FIG. 5, and thus description thereof will be omitted for purposes of clarity.

The gate circuits 100 and the jumping unis 200 may be arranged asymmetrical to one another. Each of the gate circuits 100 may be electrically connected to a corresponding one of the jumping units through a primary wire 300'.

In some embodiments, the primary wire 300' has a multistage path. The primary wire 300' may include a plurality of primary wires 300'. The plurality of primary wires 300' has multistage paths to electrically connect the gate circuits 100 to the jumping units 200.

Now, the plurality of primary wires 300' will be described in detail. In some embodiments, each of the plurality of primary wires 300' is connected at one end thereof to a gate output terminal of the gate circuit 100 and connected at the other end thereof to the jumping unit 200. The multistage path may include a straight path 310' and a right-angled path 320'. The straight path 310' extends in a transverse direction (e.g., vertically as shown in FIG. 6) of the lower substrate 20, and the right-angled path 320' extends in a longitudinal direction (e.g., horizontally as shown in FIG. 6) of the lower substrate 20.

The straight path 310' may be composed of a plurality of straight paths. The plurality of straight paths is arranged in multiple rows between the gate circuits 100 and the jumping units 200. The right-angled path 320' may be perpendicular to the plurality of straight paths 310' to connect the plurality of straight paths 310' to one another. Thus, the right-angled path 320' may also include a plurality of right-angled paths. The plurality of right-angled paths 320' electrically connects the plurality of straight paths 310' to one another. Among the right-angled paths 320', one may be connected to the gate circuit 100 and another may be connected to the jumping unit 200.

Thus, in some embodiments, the gate circuits 100 may be electrically connected to the jumping units 200 in a one-to-one manner through the primary wires 300' having the straight path 310' and the right-angled path 320'.

In the embodiment shown in FIG. 6, the straight paths 310' are arranged in multiple rows, as described above. Thus, the width (e.g., in the longitudinal direction) of an area in which the primary wires 300' are arranged can be decreased by reducing the distance between rows of the straight paths 310'.

In addition, the width of the area may be advantageously adjusted by changing the lengths of the right-angled paths 320'.

As shown in FIGS. 5 and 6, a dielectric layer 600 is disposed under a layer of the primary wires 300 or 300' according to various embodiments.

The dielectric layer 600 may be formed of a material such as $SiO_2$. Referring to FIG. 7B, the dielectric layer 600 may be stacked on the lower substrate 20 to cover (e.g., overlap with) the area under the signal transmission unit, i.e., the primary wires 300 or 300'.

Since no other wire layers are present under the primary wires 300 or 300' according to some embodiments, there is no capacitance between the primary wires and another wire layer.

In some embodiments, the dielectric layer 600 does not include a Vcom feedback (Vcom F/B) layer.

Although not shown in the drawings, it should be understood that the Vcom F/B layer may be disposed under the dielectric layer 600.

Further, a common voltage wire layer 400 (shown in FIG. 7B) may be disposed on the lower substrate 20 according to some embodiments. The common voltage wiring layer 400 may be disposed under the jumping units 200.

Some of the primary wires 300 or 300' connected to the jumping units 200 may overlap the common voltage wire layer 400. In some embodiments, the areas in which the primary wires 300 and 300' overlap the common voltage wire layer 400 may be uniform.

A certain level of capacitance may be formed between the common voltage wire layer 400 and some of the primary wires 300 or 300' overlapping the common voltage wire layer 400. Since the areas in which the primary wires 300 or 300' overlap the common voltage wire layer 400 are uniform, capacitance levels between the primary wires 300 or 300' and the common voltage wire layer 400 may be the same.

Accordingly, it is possible to efficiently prevent a gate dimming phenomenon of the display when signals outputted from the gate circuits 100 are transmitted to the pixels 500 through the primary wires 300 or 300'.

Figure 7A:
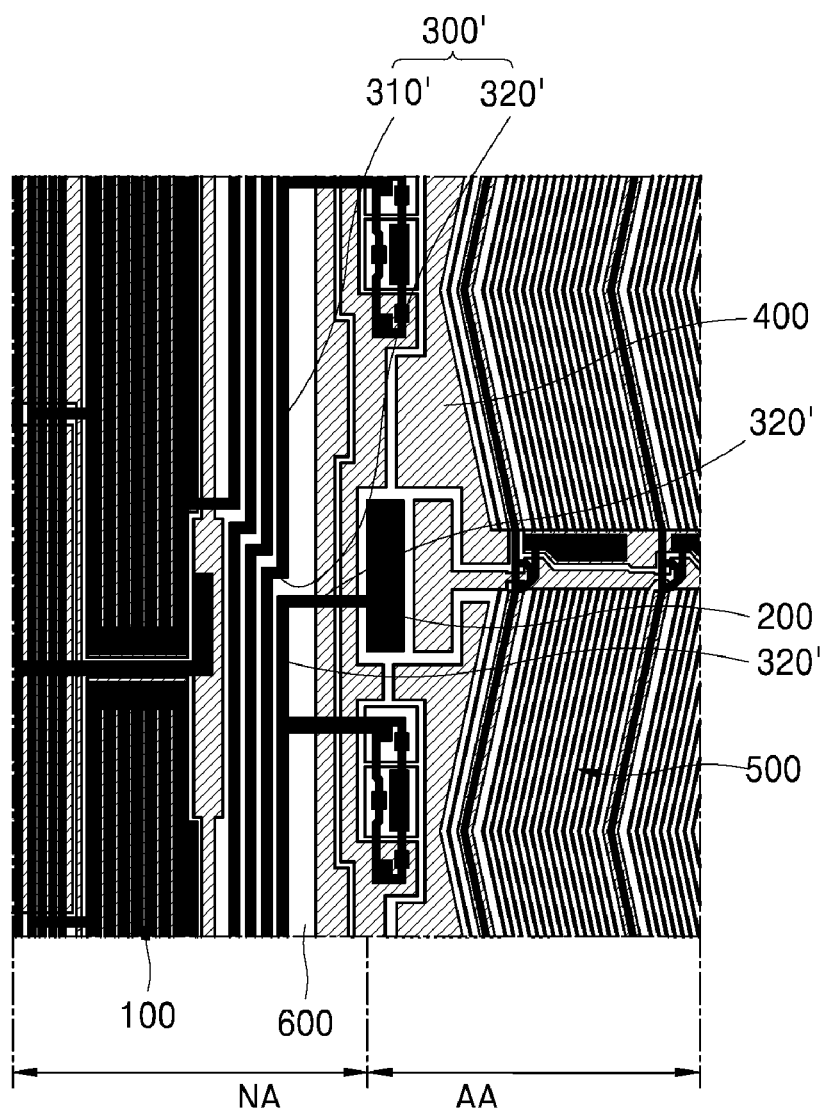
FIG. 7A is a plan view of a narrow bezel display according to an embodiment.
Figure 7B:
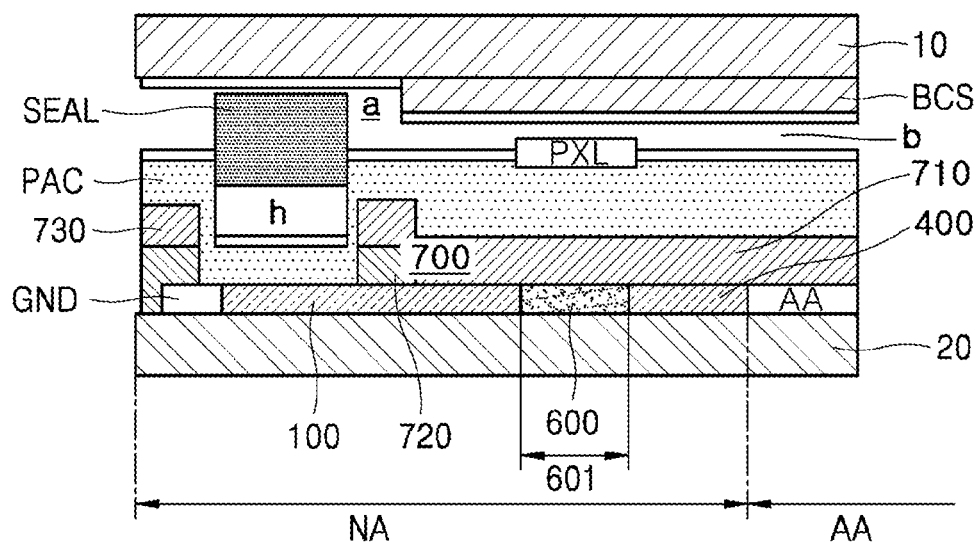
FIG. 7B is a cross-sectional view of the narrow bezel display according to according to an embodiment.

FIG. 7A is a plan view of a narrow bezel display according to an embodiment, and FIG. 7b is a cross-sectional view of the narrow bezel display according to an embodiment. Referring to FIG. 7B, the narrow bezel display according to an embodiment includes a lower substrate 20 formed of TFT glass. The lower substrate 20 defines a display area AA and a non-display area NA.

A driving layer is disposed on the non-display area NA of the lower substrate 20. The driving layer includes a gate circuit 100 and a common voltage wire layer 400.

The gate circuit 100 may include a plurality of gate circuits. The plurality of gate circuits may be arranged at predetermined intervals in the transverse direction of the lower substrate 20, as shown in FIG. 7A. The common voltage wiring layer 400 is spaced apart from the gate circuit 100, e.g., in the horizontal direction as shown in FIG. 7B. Here, a spacing region 601 is placed between the gate circuit 100 and the common voltage wiring layer 400 to provide a space therebetween.

A dielectric layer 600 may be disposed in the spacing region 601. The dielectric layer 600 may be composed of $SiO_2$. A ground GND may be disposed at one side of the gate circuit 100. Accordingly, the driving layer may include the ground GND, the gate circuit 100, the dielectric layer 600 filling the spacing region 601, and the common voltage wire layer 400.

In some embodiments, a pigment layer 700 is stacked on the driving layer. The pigment layer 700 may include a blue pigment layer 710 and a red pigment layer 720. In some embodiments, the blue pigment layer 710 covers the dielectric layer 600 and may also cover a portion of the gate circuit 100 and/or the common voltage wire layer 400. Since the dielectric layer 600 is covered with the blue pigment layer 710, light from the lower substrate 20 may not leak through an upper side of the dielectric layer 600. The red pigment layer 720 may be disposed next to the blue pigment layer 710. In addition, another blue pigment layer 730 is stacked on the red pigment layer 720. Details thereof will be described further below.

As described above, the pigment layer 700 is stacked on the driving layer. A protective layer PAC may be stacked on the pigment layer 700. As shown in FIG. 7B, the pigment layer 700 is surrounded (e.g., at least on an upper side) by the protective layer PAC. The protective layer PAC may have a predetermined thickness in the transverse direction.

A seal groove "h" having a predetermined depth may be formed at one side of the protective layer PAC. In some embodiments, the other blue pigment layer 730 is disposed around a bottom of the seal groove "h." In other words, the bottom of the seal groove "h" is surrounded by the other blue pigment layer 730 (e.g., with portions of the protective layer PAC in between).

A pixel PXL may be disposed on an upper side of the protective layer PAC. As shown in FIG. 7B, the pixel PXL is disposed on the upper side the protective layer PAC above (e.g., overlapping with) the spacing region 601. The pixel PXL may have a greater width than the spacing region 601 filled with the dielectric layer 600. The width of the pixel PXL may be greater than or equal to the width of the spacing region 601, such that the pixel PXL may prevent light leakage by blocking light from the dielectric layer 600 that passes through the blue pigment layer 710.

An upper substrate 10, which may be composed of color filter glass, may be disposed on the protective layer PAC.

In the embodiment shown in FIG. 7B, a black column spacer BCS is disposed under the upper substrate 10. The black column spacer BCS may have a greater width than the spacing region 601 filled with the dielectric layer 600. The black column spacer BCS may prevent light entering from the display area AA or the lower substrate 20 from leaking through a portion of the upper substrate 10 corresponding to the non-display area NA. In addition, a black seal SEAL to be inserted into the seal groove "h" may be disposed under the upper substrate 10. The black seal SEAL has a black color to block light and may be surrounded by the other blue pigment layer 730 when inserted into the seal groove "h."

In other words, the other blue pigment layer 730 may be stacked on the red pigment layer 720 and surround the bottom of the seal groove "h" to serve as a dam substantially surrounding at least a bottom portion of the black seal SEAL.

The black seal SEAL may also prevent light entering from the lower substrate 20 or the display area AA from leaking through a portion of the upper substrate 10 corresponding to the non-display area NA. Further, the other blue pigment layer 730 may also serve to prevent light from leaking through the upper substrate 10.

Referring to FIGS. 7A and 7B, the gate circuit 100 may include a plurality of gate circuits arranged at predetermined intervals. In the display area AA, a plurality of jumping units 200 may be arranged asymmetrical to the plurality of gate circuits 100.

The jumping units 200 are electrically connected to the pixels 500. Further, the plurality of gate circuits 100 may be electrically connected to the plurality of jumping units 200 through primary wires 300' disposed in the non-display area NA. The primary wires 300' may each have a multistage path.

As shown in FIG. 7A, the multistage path may be composed of a straight path 310' and a right-angled path 320'.

It should be understood that embodiments of the present invention is not limited thereto and the multistage path may be composed of a straight path 310 and an inclined path 320, as shown in the embodiment of FIG. 5.

In some embodiments, the dielectric layer 600 formed of $SiO_2$ is disposed under the primary wires 300'. The dielectric layer 600 may be stacked on the lower substrate 20 to cover an area under the signal transmission unit including the primary wires 300'.

Since no other wire layers are present under the signal transmission unit according to embodiments of the present invention, there is no capacitance between the signal transmission unit and another wire layer. In some embodiments, the dielectric layer 600 may not include a Vcom feedback (Vcom F/B) layer.

The common voltage wiring layer 400 may be formed under the jumping units 200. Some of the primary wires 300' connected to the jumping units 200 may overlap with the common voltage wire layer 400.

In some embodiments, since the areas in which the primary wires 300' overlap the common voltage wire layer 400 are uniform, the capacitance levels between the common voltage wire layer 400 and some of the primary wires 300' overlapping the common voltage wire layer 400 are also uniform.

Accordingly, it is possible to efficiently prevent a gate dimming phenomenon of the display when signals outputted from the gate circuits 100 are transmitted to the pixels 500 through the primary wires 300'.

Next, effects of a light leakage prevention structure of the narrow bezel display according to embodiments of the present invention will be described.

Referring to the embodiment shown in FIG. 7B an opening region "a" is formed between the black seal SEAL and the black column spacer BCS under the upper substrate 10. The opening region "a" guides UV light entering from the upper side of the upper substrate 10 to travel into a space "b" in which liquid crystal flows. Accordingly, a side surface of the black seal SEAL is exposed to the UV light entering through the opening region "a." Thus, the black seal SEAL that may have not otherwise been properly cured (e.g., without exposure to UV light) can be effectively cured by the UV light entering through the opening region "a."

In some embodiments, the pigment layer 700 is a double-pigment layer, and the other blue pigment layer 730 may surround both sides of the seal groove "h" and cover the opening region "a" such that light generated in the display area AA can be prevented from traveling to the upper side of the upper substrate 10 through the opening region "a" and the black seal SEAL, thereby preventing light leakage in the non-display area NA.

In some embodiments, the pigment layer 700 having a dual pigment dam structure surrounds both sides of the seal groove "h" in the protective layer PAC into which a lower portion of the black seal SEAL is inserted, thereby supporting the black seal SEAL. That is, the other blue pigment layer 730 may surround both sides of the seal groove "h" in the protective layer PAC, thereby serving as a stiffener maintaining the position or orientation of the black seal SEAL.

In some embodiments, the blue pigment layer 710 of the pigment layer 700 covers the dielectric layer 600 filling the spacing region 601 and can also prevent light entering from the lower substrate 20 from traveling to the upper substrate 10 through the pixel PXL above the spacing region 601, thereby efficiently preventing light leakage.

Figure 8:
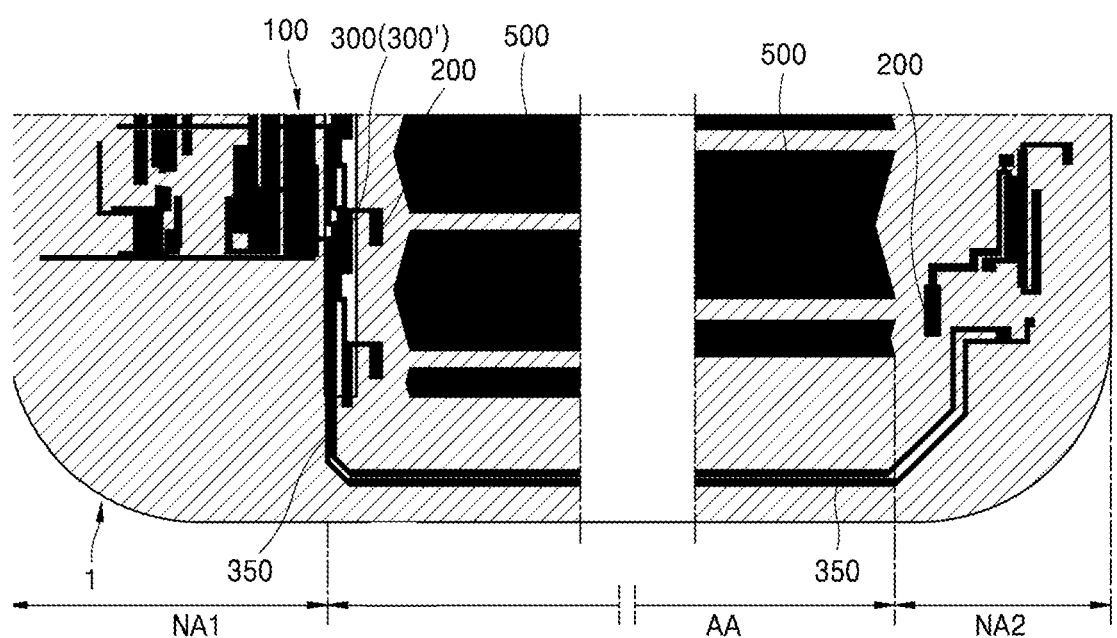
FIG. 8 is a plan view of a lower portion of the narrow bezel display according to an embodiment.
Figure 9:
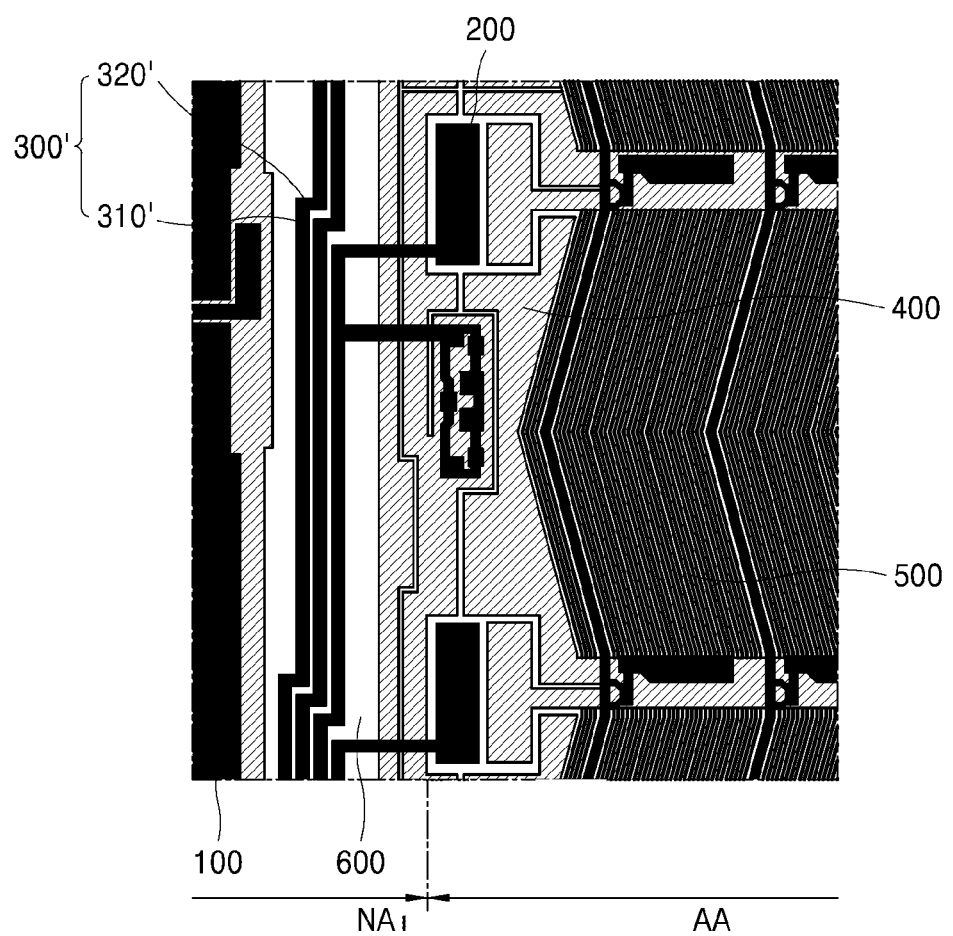
FIG. 9 is a plan view of a lower left portion of the narrow bezel display shown in FIG. 8 according to an embodiment.
Figure 10:
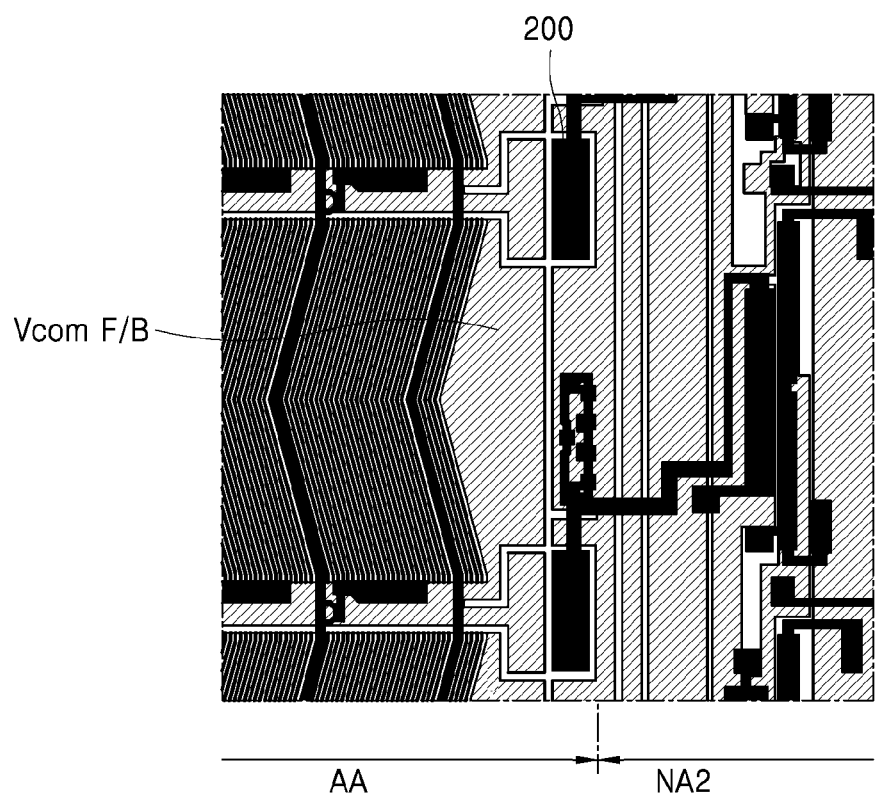
FIG. 10 is a plan view of a lower right portion of the narrow bezel display shown in FIG. 8 according to an embodiment.

FIG. 8 is a plan view of a lower portion of the narrow bezel display according to an embodiment, FIG. 9 is a plan view of a lower left portion of the narrow bezel display shown in FIG. 8 according to an embodiment, and FIG. 10 is a plan view of a lower right portion of the narrow bezel display shown in FIG. 9 according to an embodiment.

Referring to FIG. 8, the narrow bezel display according an embodiment includes a display area AA and first and second non-display areas NA1 and NA2 at the left and right sides of the display area AA, respectively.

Referring to FIG. 9, gate circuits 100 as described above are disposed in the first non-display area NA1.

The gate circuits 100 are arranged at narrower intervals than intervals at which the jumping units 200 are arranged in the display area AA, as described with reference to FIG. 6.

In some embodiments, the gate circuits 100 transmit output signals to the jumping units 200 through primary wires 300' each having a multistage path. The jumping units 200 send the output signals to respective pixels 500.

Further, the output signals from the gate circuits 100 are transmitted to the corresponding pixels 500 disposed on the right side of a main body 1 of the display, as shown in FIG. 8.

Accordingly, the output signals from the gate circuits 100 disposed on the left side of the main body 1 may be transmitted to the corresponding pixels 500 through the jumping units 200 disposed on the right and left sides of the main body 1, e.g., for displaying an image.

In some embodiments, the output signals from the gate circuits 100 disposed on the left side of the main body 1 are delivered to the jumping units 200 disposed on the right side of the main body 1 through a separate signal transmission line 350, as shown in FIG. 8.

The signal transmission line 350 may extend from a lower left end of the main body 1 to a lower right end of the main body 1 on the opposite side along an outer edge of the main body 1.

In some embodiments, a Vcom feedback layer Vcom F/B may be disposed in the second non-display area NA2 on the right side of the main body 1, as shown in FIG. 10.

Here, the Vcom feedback layer Vcom F/B may be a wire layer that is relocated from the spacing region (e.g., spacing region 601 shown in FIG. 7b) to the second non-display area NA2 on the right side of the main body 1.

In this way, the narrow bezel display according to embodiments of the present invention can provide a single GIP structure while physically preventing electrostatic failure and capacitance imbalance caused by non-uniformity of areas in which the primary wires having a multistage path overlap the Vcom feedback wire layer.

Figure 11:
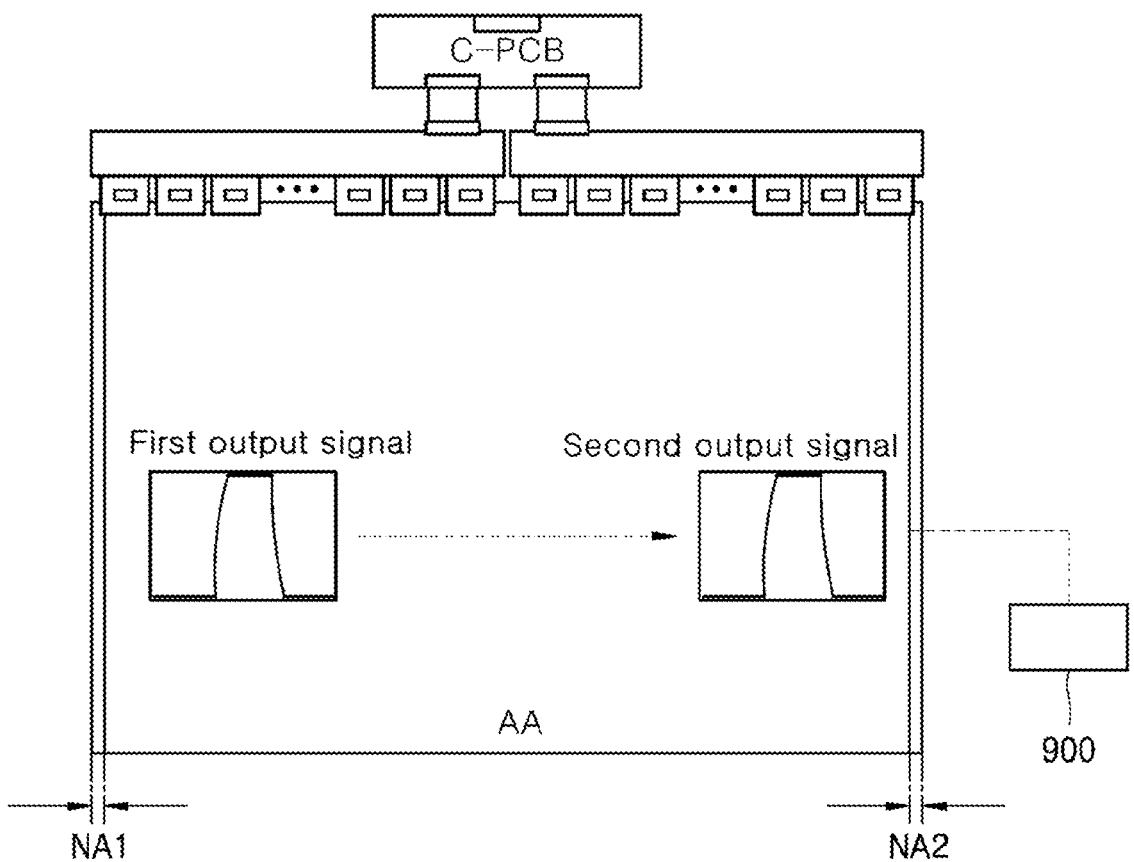
FIG. 11 is a conceptual diagram illustrating transmission of output signals from gate circuits to a side of a substrate according to an embodiment.

FIG. 11 is a conceptual diagram illustrating transmission of output signals from gate circuits to a side of a substrate according to an embodiment.

In the embodiment shown in FIG. 8, the gate circuits 100 are disposed in the first non-display area NA1 on the left side of the main body 1 to provide a single GIP structure.

As described above, the gate circuits 100 disposed on one side of the main body 1 output signals.

The output signals are delivered to the corresponding pixels through the left side of the display area AA of the main body 1.

At the same time (or close to the same time), the output signals may be delivered to corresponding pixels at the right side of the main body 1 through the signal transmission line 350, as shown in FIG. 11.

Accordingly, the output signals from the gate circuits 100 disposed on one side of the main body 1 can be transmitted through the right and left sides of the main body 1 and for displaying an image in the display area AA.

In some embodiments, a first output signal output from the gate circuits on the left side of the main body 1 may have a different voltage profile than a second output signal output at the right side of the main body through the signal transmission line 350.

For example, the voltage profile of the second output signal deviates from that of the first output signal in some time intervals.

Accordingly, the narrow bezel display according to embodiments of the present invention may further include a synchronization unit disposed in the second non-display area NA2 on the right side of the main body 1 to synchronize output signals generated by the gate circuits 100 (e.g., on the left side of the main body 1) and output the synchronized signals (e.g., to pixels 500 on the right side).

Figure 12:
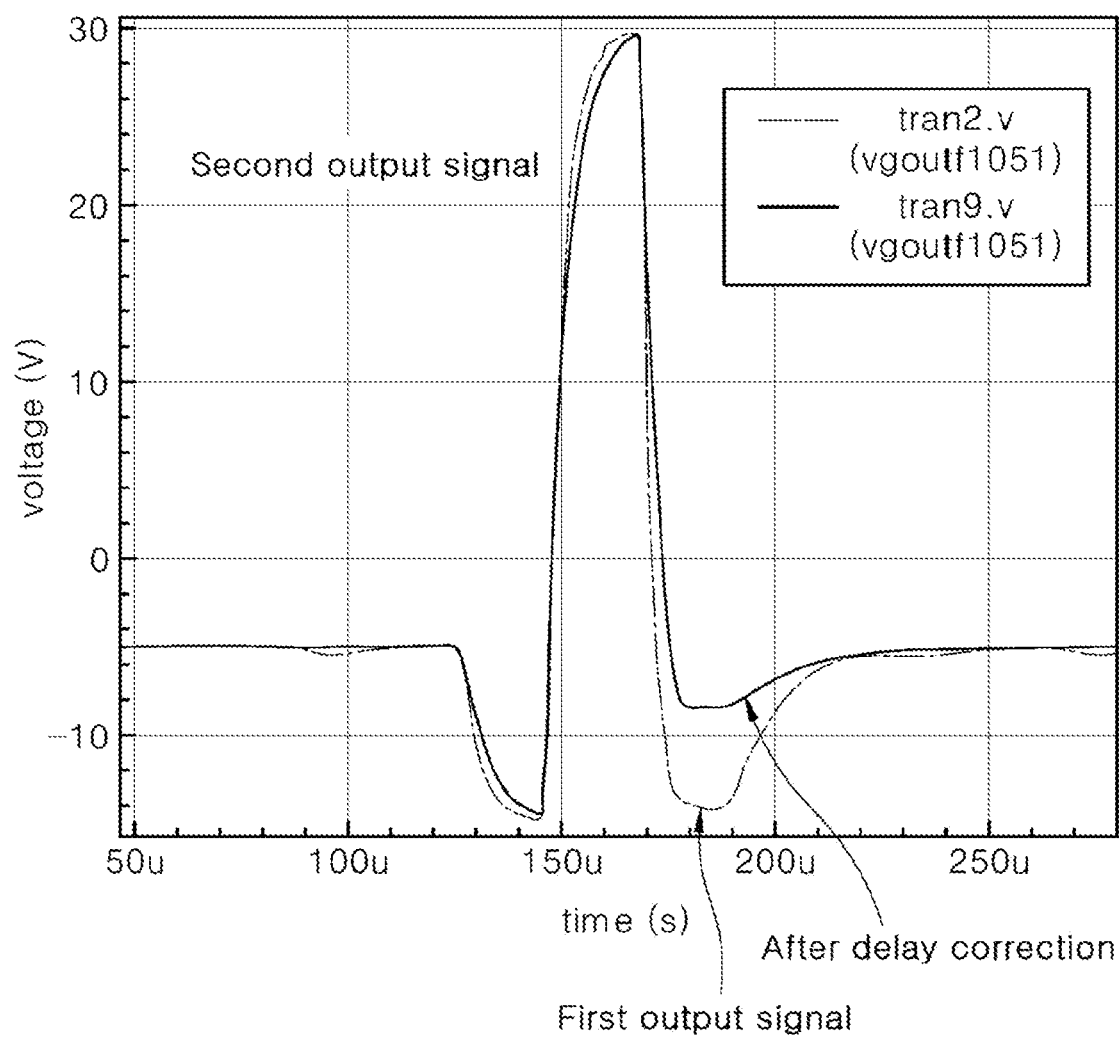
FIG. 12 is a graph showing the waveform of an output signal corrected by a synchronization unit according to an embodiment.

FIG. 12 is a graph showing the waveform of an output signal corrected by a synchronization unit according to an embodiment. Referring to FIG. 12, the synchronization unit may compensate for a voltage delay before the first output signal having a first voltage profile is output as the second output signal. For example, the synchronization unit reduces a difference in voltage profile between the first and second output signals to fall within a predetermined margin of error.

As a result, according to embodiments of the present invention, it is possible to prevent display failure such as mix of colors due to increase in gate delay caused by one-sided operation of the gate circuits in the single GIP structure.

In addition, according to embodiments of the present invention, output terminals of gate circuits are connected to jumping units through wires having a multistage path, thereby reducing the bezel size of a display.

Further, according to embodiments of the present invention, a dielectric layer is disposed under the multistage path of the wires without placing another wire layer thereunder to prevent non-uniform capacitance between the wires and an underlying wire layer, thereby preventing a dimming phenomenon during operation of the display or a short-circuit during an electrostatic test.

Further, according to embodiments of the present invention, a pigment layer and pixels are disposed on the dielectric layer, thereby preventing light leakage through the dielectric layer.

What is claimed is:

1. A display, comprising:
    a lower substrate defining a display area and a non-display area;
    a driving layer stacked on the lower substrate in the non-display area, the driving layer comprising a gate circuit and a common voltage wire layer with a spacing region therebetween;
    a dielectric layer filling the spacing region and disposed on a same layer as the common voltage wire layer, the dielectric layer having a first end and a second end that is opposite the second end, the first end of the dielectric layer adjacent to an end of the gate circuit, and the second end of the dielectric layer adjacent to an end of the common voltage wire layer;
    a protective layer stacked on the driving layer;
    a pixel disposed on the protective layer and overlapping with the spacing region; and
    an upper substrate disposed on the protective layer.

2. The display according to claim 1, wherein the gate circuit comprises a plurality of gate circuits, the plurality of gate circuits being arranged at predetermined intervals, and wherein the display further comprises:
    a plurality of jumping units arranged in the display area to be asymmetrical to the arrangement of the plurality of gate circuits; and
    signal transmission units arranged in the non-display area and having multistage paths to electrically connect the plurality of gate circuits to the plurality of jumping units.

3. The display according to claim 2, further comprising:
    a pigment layer disposed on the driving layer,
    wherein the pigment layer overlapping with the spacing region.

4. The display according to claim 2, wherein areas in which the multistage paths overlap the common voltage wire layer are uniform.

5. The display according to claim 2, wherein the common voltage wire layer is disposed between the multistage paths and the substrate, a first one of the multistage paths overlapping a first area of the common voltage wire layer, a second one of the multistage paths overlapping a second area of the common voltage wire layer, the first area having a same area as the second area.

6. The display according to claim 1, further comprising:
    a black column spacer under the upper substrate, the black column spacer overlapping with the spacing region.

7. The display according to claim 1, wherein the non-display area comprises a first non-display area and a second non-display area disposed at opposite sides of the display area, the gate circuit disposed in the first non-display area, and wherein the display further comprises a synchronization unit disposed in the second non-display area to synchronize output signals generated from the gate circuit.

8. The display according to claim 1, wherein the gate circuit is on a same layer as the common voltage wire layer.

9. The display according to claim 1, wherein the dielectric layer separates the common voltage wire layer from the gate circuit, and wherein the dielectric layer is on a same layer as the common voltage wire layer and the gate circuit.

10. The display according to claim 1, further comprising:
a pigment layer disposed on the driving layer,
wherein the pigment layer is between the driving layer and the protective layer, and
wherein the protective layer includes a groove.

11. The display according to claim 10, further comprising:
a seal disposed in the groove.

12. The display according to claim 10, wherein the pigment layer includes (i) a first pigment layer overlapping the common voltage wire layer and the gate circuit, and (ii) a second pigment layer adjacent to the groove of the protective layer, the first and second pigment layers having different colors.

13. The display according to claim 1, wherein the pixel is in the non-display area and overlaps the dielectric layer filling the spacing region.

* * * * *